(12) United States Patent
Palmer et al.

(10) Patent No.: US 12,245,397 B2
(45) Date of Patent: Mar. 4, 2025

(54) COORDINATED CONTROL OF MULTIPLE COMPONENTS FOR CLOSED-LOOP ENCLOSURE COOLING

(71) Applicant: Ice Qube, Inc., Greensburg, PA (US)

(72) Inventors: Jeffrey Scott Palmer, Greensburg, PA (US); Adam Johnson, Greensburg, PA (US)

(73) Assignee: Ice Qube, Inc., Greensburg, PA (US)

( * ) Notice: Subject to any disclaimer, the term of this patent is extended or adjusted under 35 U.S.C. 154(b) by 394 days.

(21) Appl. No.: 17/885,497

(22) Filed: Aug. 10, 2022

(65) Prior Publication Data

US 2023/0046544 A1 Feb. 16, 2023

Related U.S. Application Data

(60) Provisional application No. 63/232,040, filed on Aug. 11, 2021.

(51) Int. Cl.
  G06F 1/16 (2006.01)
  H05K 5/00 (2006.01)
  H05K 7/00 (2006.01)
  H05K 7/20 (2006.01)

(52) U.S. Cl.
  CPC ......... H05K 7/20209 (2013.01); H05K 7/202 (2013.01)

(58) Field of Classification Search
  CPC ............... H05K 7/202; H05K 7/20209; H05K 7/20172; H05K 7/2019; H05K 7/20145; H05K 7/20136; H05K 7/20009
  See application file for complete search history.

(56) References Cited

U.S. PATENT DOCUMENTS

| | | | |
|---|---|---|---|
| 2012/0065795 A1* | 3/2012 | Blackshaw | F24F 11/46 62/89 |
| 2020/0263891 A1* | 8/2020 | Noor | F24F 11/61 |
| 2022/0042693 A1* | 2/2022 | Altman | H05K 7/20209 |
| 2022/0136698 A1* | 5/2022 | Jayarathne | F23N 5/022 431/13 |
| 2022/0412589 A1* | 12/2022 | Palmer | F24F 11/30 |
| 2023/0046544 A1* | 2/2023 | Palmer | H05K 7/202 |

* cited by examiner

*Primary Examiner* — Anthony M Haughton
(74) *Attorney, Agent, or Firm* — Gabriel & Co; Andrew M Gabriel

(57) ABSTRACT

One example implementation provides a method for controlling enclosure interior temperature, including obtaining, from a thermostat, temperature data indicative of interior enclosure temperature; determining, using a controller, that the temperature data indicates that the interior enclosure temperature exceeds a set point; simulating for a heat exchanger, using the controller, loss of alternating current (AC) power supply; and thereafter operating, using the controller, the heat exchanger and an air conditioner above the set point.

20 Claims, 3 Drawing Sheets

COORDINATED CONTROL OF MULTIPLE COMPONENTS FOR CLOSED-LOOP ENCLOSURE COOLING

CROSS-REFERENCE TO RELATED APPLICATIONS

This application claims priority to U.S. provisional patent application Ser. No. 63/232,040, having the same title as this application and filed on 11 Aug. 2021, the contents of which are incorporated by reference herein.

BACKGROUND

Industry and manufacturing have emerged with the widespread use of enclosures for a variety of content, for example electronics or other items that require protection from the elements as well as cooling. For example, to protect these items from harsh environments, items are typically placed in sealed enclosures or cabinets that permit efficient operation without the threat of being exposed to exterior contaminates including dust, residue, rain and liquids that have the potential to cause serious damage. Since the items (such as electronics or like equipment) often generate heat within the enclosure, various cooling equipment such as air conditioners, heat exchangers, in-line compressed air coolers and filtered fan systems are used to maintain required operating temperatures within the enclosure.

Certain cooling systems often treat the enclosed air only, while sealing out the potential contaminated ambient environment ("closed-loop" cooling). In cases where the ambient air is near room temperature (70-85 degrees Fahrenheit) and when there is not a threat of rain or splashing liquids present outside the enclosure, a filtered fan system is used to maintain a constant flow of filtered ambient air through the enclosure. These filtered fan systems typically are less costly than closed-looped systems and simply employ a fan which induces the cooler ambient air through a filter media into the enclosure, therefore creating a positive pressure inside the enclosure forcing the hot enclosure air out through an exhaust vent.

In circumstances where closed-loop cooling is required, use of a filtered-fan or similar system is unacceptable, as the system is required to keep ambient air (outside the cabinet) on the exterior, only operating on the enclosure air.

SUMMARY

In summary, an embodiment provides a method, comprising: obtaining, from a thermostat, temperature data indicative of interior enclosure temperature; determining, using a controller, that the temperature data indicates that the interior enclosure temperature exceeds a set point; simulating for a heat exchanger, using the controller, loss of alternating current (AC) power supply; and thereafter operating, using the controller, the heat exchanger and an air conditioner above the set point.

Another embodiment provides a system, comprising: a heat exchanger; an air conditioner; and a controller operatively coupled to the heat exchanger and the air conditioner, the controller being configured to: obtain, from a thermostat, temperature data indicative of interior enclosure temperature; determine that the temperature data indicates that the interior enclosure temperature exceeds a set point; simulate for a heat exchanger loss of alternating current (AC) power supply; and thereafter operate the heat exchanger and an air conditioner above the set point.

A further embodiment provides a controller configured to: obtain, from a thermostat, temperature data indicative of interior enclosure temperature; determine that the temperature data indicates that the interior enclosure temperature exceeds a set point; simulate for a heat exchanger loss of alternating current (AC) power supply; and thereafter operate the heat exchanger and an air conditioner above the set point.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the claims, but is merely representative of those embodiments.

Reference throughout this specification to "embodiment(s)" (or the like) means that a particular feature, structure, or characteristic described in connection with the embodiment is included in at least one embodiment. Thus, appearances of the phrases "according to embodiments" or "in an embodiment" (or the like) in various places throughout this specification are not necessarily all referring to the same embodiment.

Furthermore, the described features, structures, or characteristics may be combined in any suitable manner in one or more embodiments. In the following description, numerous specific details are provided to give a thorough understanding of example embodiments. One skilled in the relevant art will recognize, however, that aspects can be practiced without one or more of the specific details, or with other methods, components, materials, etc. In other instances, well-known structures, materials, or operations are not shown or described in detail to avoid obfuscation.

As used herein, "connecting" includes indirect connections.

One embodiment provides a cooling system for an enclosure or cabinet that houses components, e.g., heat generating components such as electronics. In an embodiment, the cooling system comprises an air conditioner, a heat exchanger, and a controller configured to coordinate operation of the air conditioner and the heat exchanger to maintain enclosure air within an operating temperature range.

Figure 1:
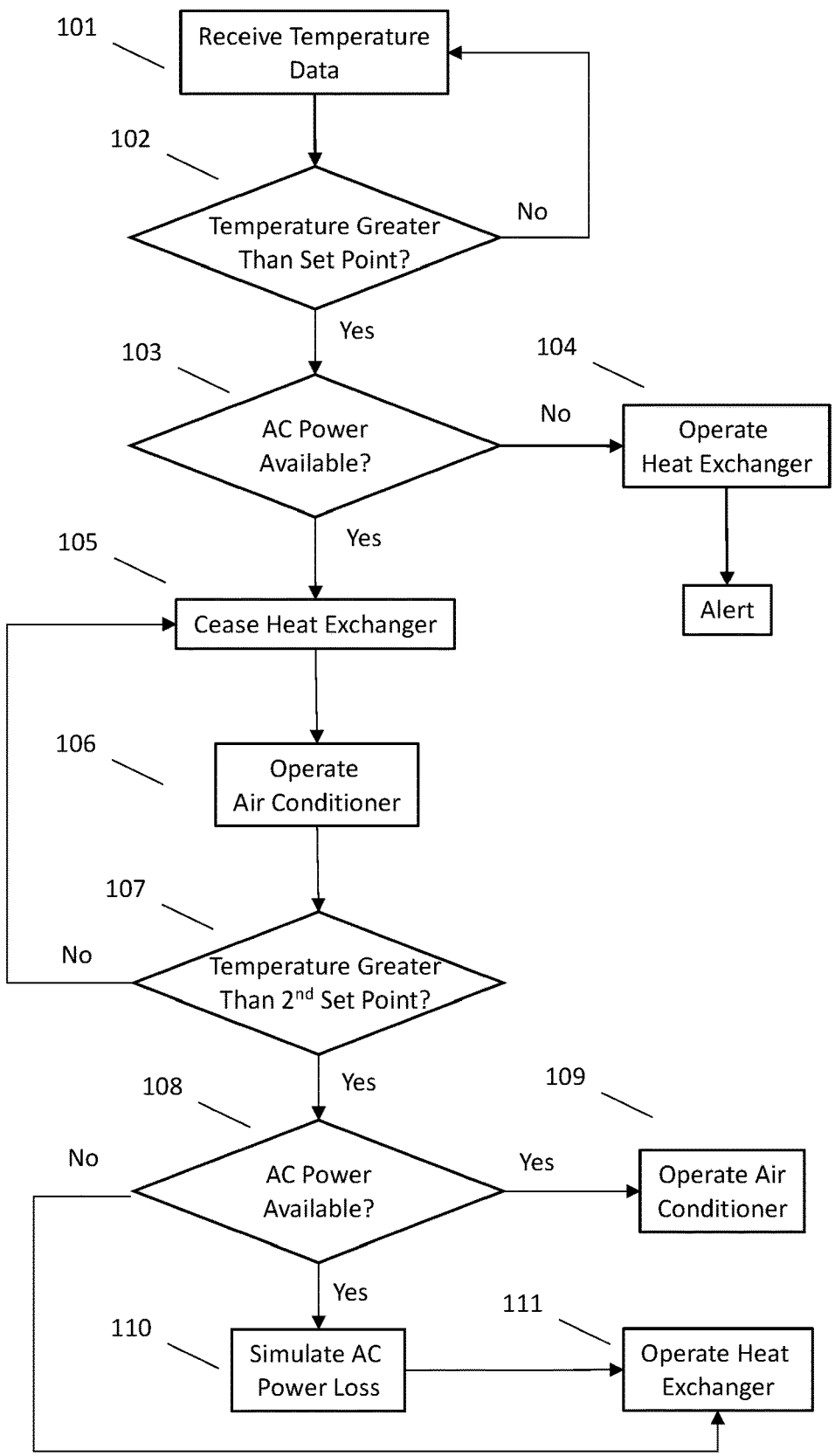
FIG. 1 illustrates an example method according to an embodiment.
Figure 2:
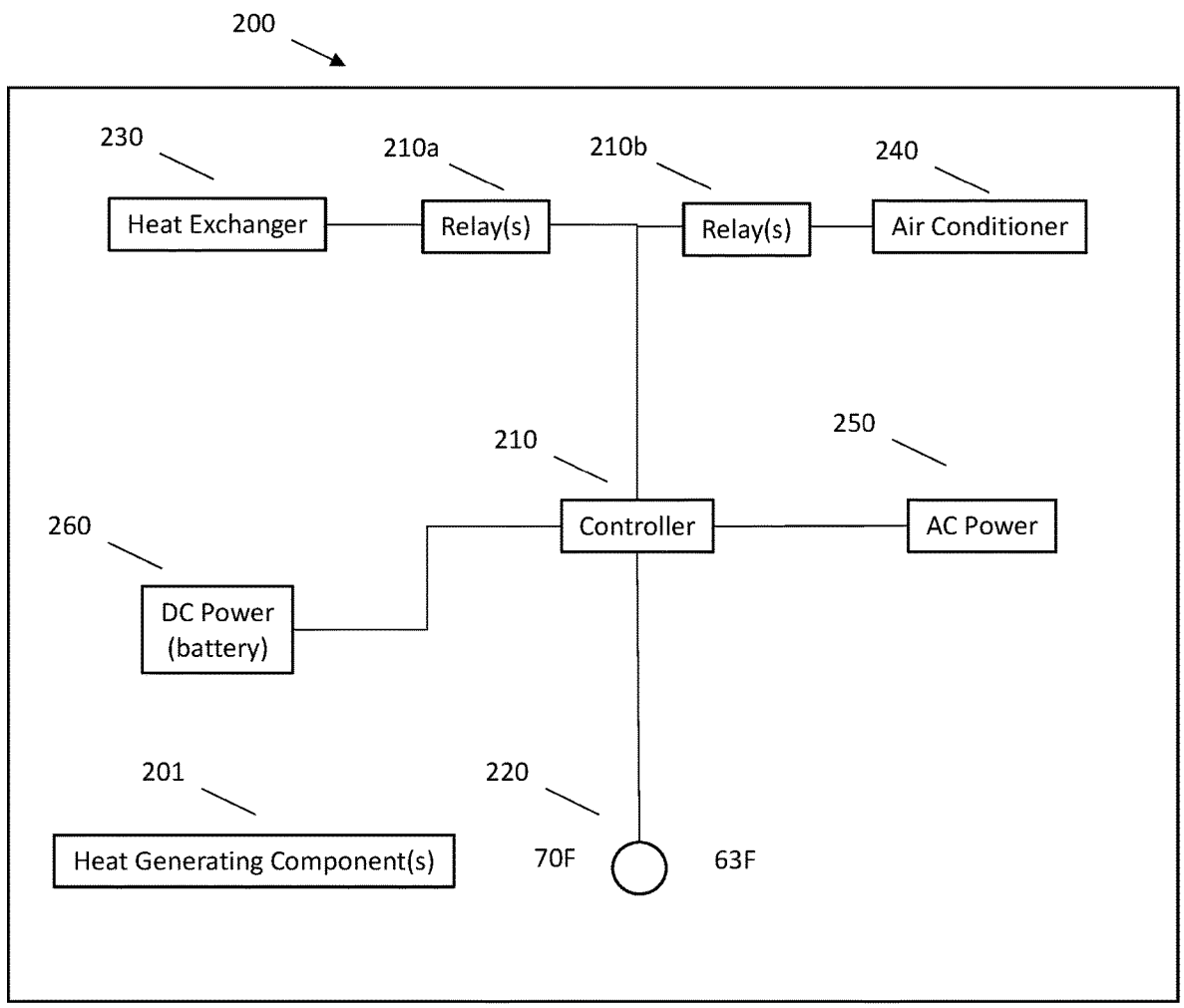
FIG. 2 illustrates an example system according to an embodiment.

Referring to FIG. 1-2, in an embodiment, a controller receives temperature data 101 that indicates the interior enclosure temperature of an enclosure 200. Controller 210 determines 102 if the interior enclosure temperature is above a set point. It will be readily understood by those having ordinary skill in the art that the "interior enclosure temperature" may be inferred, e.g., by use of an ambient temperature proxy or via direct measurement of the interior enclosure temperature. Controller 210 includes or uses a plurality of relays 210a, 210b to operate contacts or circuits operatively connected to an air conditioner 240, a heat exchanger 230, a source of alternating current (AC) power 250, a source of direct current (DC) power 240 (such as a battery), or a combination of the foregoing.

In an embodiment, controller 210 acts to monitor a sensed temperature at 101-102, such as ambient air temperature, enclosure air temperature, or a combination thereof, sensed via thermostat 220, and in response to a temperature measurement, controller 210 may act to operate air conditioner 240, heat exchanger 230, or a combination thereof, e.g., based on comparison to a set point.

In an embodiment, with heat exchanger 230 operating, controller 210 is configured to respond to a sensed temperature increase at 102 by ceasing operation of heat exchanger 230 in favor of operating air conditioner 240 when AC power is available, for example as indicated at 101-105 of FIG. 1. If AC power is not available, controller 210 may continue operating heat exchanger 230 and throw an alarm.

By way of example, controller 210 responds to an ambient air temperature below a threshold, for example 63 degrees Fahrenheit (F), with activation of heat exchanger 230 (not illustrated in FIG. 1), to remove heat from the air of enclosure 200 and expel the heat into the ambient environment while maintaining a closed loop. In an embodiment, the activation of heat exchanger 230 is coordinated with the operation of air conditioner 240, e.g., air conditioner 240 is switched off or remains off in favor of using heat exchanger 230 below a first set point.

In an embodiment, controller 210 is configured to respond to a temperature at or above a threshold, which may be the same or different than other threshold(s), to activate air conditioner 240 and cease operation of heat exchanger 230, as indicated at 105 and 106 of FIG. 1. For example, controller 210 may be configured to respond to data indicative of a sensed ambient air temperature of above 70 F by activating air conditioner 240 at 106 for enclosure cooling and ceasing operation of heat exchanger 230 at 105.

In an embodiment, controller 210 acts to monitor a sensed power source availability, as indicated at 103 and 108 of FIG. 1, such as availability of alternating current power, direct current power, or a combination thereof. In response to a power source's availability, controller 240 may act to operate air conditioner 240, heat exchanger 230, or a combination thereof. Further, controller 210 may issue an alert, alarm, or message in connection with responding to temperature data, power availability data, and/or operational state data for components such as heat exchanger 230 and air conditioner 240.

In an embodiment, controller 210 is configured to respond to a lack of alternating current power, as indicated at 103 and 108, by activating a direct current power source 260, e.g., a battery. In an embodiment, the direct current power source 260 is operable to operate heat exchanger 230 but not air conditioner 240. Direct power source 260 may also power controller 200, which may be used to issue alerts, alarms, or messages, e.g., to a remote or networked device such as a computer or handset/mobile application.

In an embodiment, controller 210 is configured to simulate loss of a power source, e.g., alternating current power source 250. In one example, controller 210 is configured to respond to data, such as an indication of ambient air temperature exceeding a high set point, as determined at 107, to simulate loss of alternating current power source 250, as indicated at 110 of FIG. 1, activating heat exchanger 230, a direct current power source 260, or both, as indicated at 111. In an embodiment, this may act as a guard against an upper temperate limit violation, allowing heat exchanger 230 that runs only on direct current to be activated, even when alternating current is available, as determined at 108, and is used to simultaneously operate air conditioner 240 of the enclosure 200, as indicated at 109 and 111 of FIG. 1.

In the specific example of FIG. 1, it is illustrated that the by use of two set point temperatures, controller 210 receives temperature data indicative of the enclosure interior temperature, which may be used to initially operate heat exchanger 230 but not air conditioner 240, thereafter stop or cease operation of heat exchanger 230 in favor of air conditioner, as well as respond to a further increase in temperature by powering both of heat exchanger 230 and air conditioner 240, even if heat exchanger 230 is normally configured to cease operation while air conditioner 240 is active (via sensed AC power supply). Controller accomplishes this latter operational state via simulation of AC power loss, as indicated at 110 of FIG. 1.

It may be desirable to operate enclosure 200 such as a 5G telecommunications cabinet, housing heat generating electronics, with a closed loop cooling system to protect the contents of the cabinet or enclosure 200 (e.g., heat generating components 201) from ambient air contaminates or other environmental factors such as rain. In one example, a cabinet 200 may be supplied with battery backup power as DC power source 260, for example to run certain electronics on the condition of a loss of alternating current power from a commercial power supply. In such a cabinet 200, it may be beneficial to run all or some of the cooling components, such as heat exchanger(s) 230 or air conditioning unit(s) 240, using the direct current supplied by a series of batteries, e.g., 48V DC current supply. However, to run all cooling components on the DC power may be prohibitive. Thus, certain components, such as heat exchanger(s) 230, may be supplied with DC power, whereas others, e.g., air conditioner(s) 240 are configured to run only on and when alternating current power supply 250 is available.

Further, it may be desirable to reduce the cost or energy consumption of the cooling system for a cabinet or enclosure 200. For example, when ambient temperatures permit, it may be beneficial to run certain components, e.g., heat exchanger(s) 230, rather than other components, e.g., air conditioner(s) 240, because the certain components use less energy. However, the coordination of the various components is required, e.g., because the cabinet 200 internal temperature must be adequately maintained.

In an embodiment, controller 200 includes or uses a plurality of relays 210a, 210b, such as normally closed (NC) and/or normally open (NO) to operate contacts, relays, or circuits operatively connected to air conditioner 240, heat exchanger 230, a source of alternating current power 250, a source of direct current power 260 (such as a battery), or a combination of the foregoing.

In an embodiment, controller 210 is configured to respond to a sensed temperature by activating operation of heat exchanger 230. In one example, controller 210 responds to an ambient air temperature below a threshold, for example 63 degrees Fahrenheit (F), to activate heat exchanger 230 to remove heat from the air of enclosure 200 and expel the heat into the ambient environment while maintaining a closed loop. In an example, heat exchanger 230 is configured to run on direct current supplied normally by an alternating current source 250, e.g., by transformer (not illustrated in FIG. 2) that converts the alternating current into direct current. In one example, heat exchanger 230 may also run on direct current supplied by a direct current power supply 260 such as a battery, e.g., when the alternating current is unavailable or is indicated as unavailable (e.g., as further described herein).

In an embodiment, the activation of heat exchanger 230 is coordinated with the operation of air conditioner 240, e.g., air conditioner 240 is switched off in favor of using heat exchanger 230, such as at lower ambient (external to enclosure) temperatures, as sensed by controller 210. In one example, an ambient air temperature setpoint of 63 F is used as an indication that air conditioner 240 should cease running and heat exchanger 230 should begin or continue running.

In an embodiment, controller 210 is configured to respond to a temperature at or below a threshold, which may be the same or different than other threshold(s), to activate air conditioner 240 and cease operation of heat exchanger 230. For example, the controller may be configured to respond to data indicative of a sensed ambient air temperature of above 70 F by activating air conditioner 240 for enclosure cooling and ceasing operation of heat exchanger 230. Further, controller may use a set point above 70 F to ensure a thermal limit is not exceed for enclosure air temperature, e.g., operating both heat exchanger 230 and air conditioner 240 at the same time.

In an embodiment, controller 210 is configured to simulate loss of a power source, e.g., alternating current from AC power supply 250. In one example, controller 210 is configured to respond to data, such as an indication of ambient air temperature, to simulate loss of alternating current power, e.g., removing a signal from a relay 210a that typically acts to indicate that air conditioner 240 is active and that heat exchanger 230 should remain inactive, activating heat exchanger 230 in combination with air conditioner 240. In an embodiment, heat exchanger 230 may thereafter run using a direct current power source 260, the alternating power source 250, or both. In an embodiment, this may act as a guard against an upper temperate limit violation, e.g., of the enclosure air temperature and/or the ambient air temperature, allowing heat exchanger 230 that runs typically on direct current to be activated, even when alternating current is available and is used to simultaneously operate air conditioner 240 of enclosure 200.

In an embodiment, a housing, e.g., controller housing, houses a controller 200 with a touchscreen for data entry. Controller 200 is configured to control relays 210a, 210b, contacts or switches for air conditioner 240 and heat exchanger 230, as described herein. In the example of FIG. 2, controller 200 is operatively connected to a lower panel of terminal blocks (not explicitly illustrated) that receive alternating current and direct current power as well as act for connecting heat exchanger 230 and air conditioner 240, or several of these, to controller housing and thus operatively connecting them to controller 200. Controller 200 and the terminal blocks are connected via relays 210a, 210b, which may include or alternatively be implemented as switches or circuits, for signaling operating conditions to heat exchanger 230 and air conditioner 240.

The example of FIG. 2 shows a simplified diagram for an example embodiment. Here it can be appreciated that controller 200 acts to logically control relays 210a, 210b (which may be a pair of AC power relays and a pair of DC power relays) to communicate power and therefore operation, via terminal blocks, to heat exchanger 230 and air conditioner 240.

As described herein, the lowering of ambient temperature causes controller 200 to remove power from air conditioner 240 and supply it, e.g., via DC interchange, to power heat exchanger 230 using DC. When the temperature rises, heat exchanger 230 ceases operation and air conditioning unit 240 operates to take over control of cooling enclosure 200 or cabinet (not specifically illustrated). Thereafter, on further temperature increase, controller 200 simulates AC power loss via relay signal to allow heat exchanger 230 to begin operation in parallel with air conditioner 240 in the presence of AC power.

Figure 3:
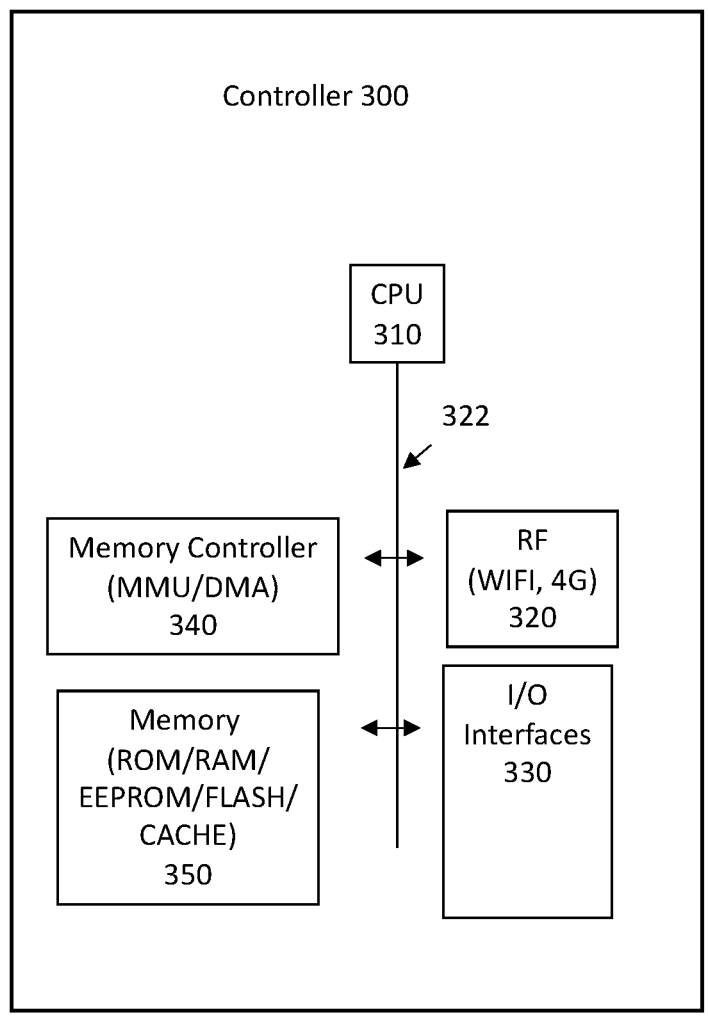
FIG. 3 illustrates an example controller according to an embodiment.

Turning to FIG. 3, an example device that may be used in implementing one or more embodiments includes a controller 200 in the form of a microcontroller computing device or a control panel.

Controller 300 may execute program instructions or code or operate using dedicated circuitry configured to process data or signals and perform other functionality of the embodiments. Components of controller 300 may include, but are not limited to, a processing unit, which may take a variety of forms such as a central processing unit (CPU) 310, a programmable circuit or other programmable hardware, non-programmable hardware, a combination of the foregoing, etc., a system memory controller 340 and memory 350, as well as a system bus 322 that couples various system components including the system memory 350 to the processing unit 310. It is noted that in certain implementations, controller may take a reduced or simplified form, such as a micro-control unit implemented in a control panel of a cooling system, or even non-programmable hardware such as a series of relays, switches, or circuits, where certain of the components of controller are omitted or combined, or the "controller" is formed by one or more of these other elements.

Controller 300 may include or have access to a variety of non-transitory computer readable media. Memory 350 may include non-transitory computer readable storage media in the form of volatile and/or nonvolatile memory devices such as read only memory (ROM) and/or random-access memory (RAM). By way of example, and not limitation, memory 350 may also include an operating system, application programs, other program modules, and program data. For example, memory 350 may include application programs such as variable speed control software and/or air conditioner operational software for implementing various cooling protocols, as described herein. Data may be transmitted by wired or wireless communication elements 330, 320, respectively, e.g., to or from first device to another device, e.g., communication between a remote device or system such as controller 300.

A user can interface with (for example, enter commands and information) the controller 300 through input devices such as a touch screen, keypad, etc. A monitor or other type of display screen or device may also be connected to system bus 322 via an interface. Controller 300 may operate in a networked or distributed environment using logical connections to one or more other remote computers or databases. The logical connections may include a network, such local area network (LAN) or a wide area network (WAN) but may also include other networks/buses. In one example, controller 300 is remotely controllable via Ethernet.

It should be noted that various functions described herein may be implemented using processor executable instructions stored on a non-transitory storage medium or device or using dedicated circuitry or circuits. A non-transitory storage device may be, for example, an electronic, electromagnetic, or semiconductor system, apparatus, or device, or any suitable combination of the foregoing. More specific examples of a non-transitory storage medium include the following: a portable computer diskette, a hard disk, a random-access memory (RAM), a read-only memory (ROM), an erasable programmable read-only memory (EPROM or Flash memory), a portable compact disc read-only memory (CD-ROM), a solid-state drive, or any suitable combination of the foregoing. In the context of this document "non-transitory" media includes all media except non-statutory signal media.

Program code embodied on a non-transitory storage medium may be transmitted using any appropriate medium, including but not limited to wireless, wireline, optical fiber cable, RF, etc., or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), a personal area network (PAN) or the connection may be made through other devices (for example, through the Internet using an Internet Service Provider), through wireless connections, or through a hard wire connection, such as over a USB or another power and data connection.

It is worth noting that while specific elements are illustrated in the figures, and a particular ordering or organization of elements or steps has been illustrated, these are non-limiting examples. In certain contexts, two or more elements or steps may be combined into an equivalent element or step, an element or step may be split into two or more equivalent elements or steps, or certain elements or steps may be re-ordered or re-organized or omitted as appropriate, as the explicit illustrated examples are used only for descriptive purposes and are not to be construed as limiting.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected by one skilled in the art without departing from the scope or spirit of the disclosure.

What is claimed is:

1. A method, comprising:
   obtaining, from a thermostat, temperature data indicative of interior enclosure temperature;
   determining, using a controller, that the temperature data indicates that the interior enclosure temperature exceeds a set point;
   simulating for a heat exchanger, using the controller, loss of alternating current (AC) power supply; and
   thereafter operating, using the controller, the heat exchanger and an air conditioner above the set point.

2. The method of claim 1, comprising:
   determining, using the controller, that the temperature data indicates that the interior enclosure temperature is lower than the set point; and
   signaling, with the controller, one or more of the air conditioner and the heat exchanger to cease operation.

3. The method of claim 2, wherein the signaling comprises ceasing the simulating.

4. The method of claim 1, wherein the heat exchanger is configured to operate only in the absence of AC power.

5. The method of claim 1, wherein the simulating comprises one or more of adding or removing input to a relay connecting the AC power supply to the heat exchanger.

6. The method of claim 5, wherein the simulating comprises modifying input to a normally closed relay connecting the AC power supply to the heat exchanger.

7. The method of claim 1, wherein the set point comprises two set points;
   the method further comprising:
   determining that the interior enclosure temperature is lower than a first set point of the two set points;
   determining that the interior enclosure temperature is lower than a second set point of the two set points; and
   signaling, with the controller, the air conditioner to cease operation.

8. The method of claim 1, wherein the controller comprises one or more relays configured to carry out the simulating.

9. The method of claim 8, wherein the one or more relays are operatively connected to the AC power supply and a direct current (DC) power supply.

10. The method of claim 9, wherein the DC power supply is a battery.

11. A system, comprising:
    a heat exchanger;
    an air conditioner; and
    a controller operatively coupled to the heat exchanger and the air conditioner, the controller being configured to:
    obtain, from a thermostat, temperature data indicative of interior enclosure temperature;
    determine that the temperature data indicates that the interior enclosure temperature exceeds a set point;
    simulate for a heat exchanger loss of alternating current (AC) power supply; and
    thereafter operate the heat exchanger and an air conditioner above the set point.

12. The system of claim 11, wherein the controller is configured to:
    determine that the interior enclosure temperature is lower than the set point; and
    signal one or more of the air conditioner and the heat exchanger to cease operation.

13. The system of claim 12, wherein to signal comprises ceasing the simulating.

14. The system of claim 11, wherein the heat exchanger is configured to operate only in the absence of AC power.

15. The system of claim 11, wherein the controller comprises one or more relays connecting the AC power supply to the heat exchanger, and wherein to simulate comprises one or more of adding or removing input to the one or more relays.

16. The system of claim 15, wherein to simulate comprises modifying input to a normally closed relay of the one or more relays.

17. The system of claim 11, wherein the set point comprises two set points;
the controller further being configured to:
determine that the interior enclosure temperature is lower than a first set point of the two set points;
determine that the interior enclosure temperature is lower than a second set point of the two set points; and
signal, with the controller, the air conditioner to cease operation.

18. The system of claim 17, comprising a battery operatively coupled to one or more of the heat exchanger and the air conditioner.

19. The system of claim 11, comprising an enclosure.

20. A controller configured to:
obtain, from a thermostat, temperature data indicative of interior enclosure temperature;
determine that the temperature data indicates that the interior enclosure temperature exceeds a set point;
simulate for a heat exchanger loss of alternating current (AC) power supply; and
thereafter operate the heat exchanger and an air conditioner above the set point.

\* \* \* \* \*